United States Patent
Liu et al.

[11] Patent Number: 6,159,857
[45] Date of Patent: Dec. 12, 2000

[54] ROBUST POST CU-CMP IMD PROCESS

[75] Inventors: Chung-Shi Liu; Chen-Hua Yu, both of Hsin-Chu, Taiwan

[73] Assignee: Taiwan Semiconductor Manufacturing Company, Hsin-Chu, Taiwan

[21] Appl. No.: 09/349,849

[22] Filed: Jul. 8, 1999

[51] Int. Cl.⁷ .................................................. H01L 21/44
[52] U.S. Cl. .......................... 438/687; 438/627; 438/643; 438/675
[58] Field of Search ........................ 438/687, 643, 438/626, 627, 644, 648, 650, 658, 661, 653, 660, 651, 672, 680, 669, 703, 742, 675; 257/741, 767

[56] References Cited

U.S. PATENT DOCUMENTS

| | | | |
|---|---|---|---|
| 3,837,929 | 9/1974 | Caule | 148/258 |
| 4,910,169 | 3/1990 | Hoshino | 438/660 |
| 5,281,304 | 1/1994 | Kadomura | 438/703 |
| 5,391,517 | 2/1995 | Gelatos et al. | 438/643 |
| 5,447,887 | 9/1995 | Filipiak et al. | 438/644 |
| 5,677,244 | 10/1997 | Venkatraman | 438/643 |
| 5,693,563 | 12/1997 | Teong | 437/190 |
| 5,744,376 | 4/1998 | Chan et al. | 438/643 |
| 5,814,557 | 9/1998 | Venkatraman et al. | 438/622 |
| 5,818,110 | 10/1998 | Cronin | 257/775 |
| 6,016,000 | 1/2000 | Moslehi | 257/522 |
| 6,043,153 | 3/2000 | Nogami et al. | 438/687 |

*Primary Examiner*—Matthew Smith
*Assistant Examiner*—Igwe U. Anya
*Attorney, Agent, or Firm*—George O. Saile; Stephen B. Ackerman; Larry J. Prescott

[57] ABSTRACT

A method is provided for cleaning exposed copper surfaces in damascene structures after chemical mechanical polishing of the copper. In a first embodiment exposed copper is annealed in a forming gas environment, a mixture of hydrogen and nitrogen, after chemical mechanical polishing, or other etching means, is used to remove the copper down to the top of the trench dielectric. A layer of silicon nitride, SiN, is then immediately deposited, preferably in situ, over the exposed copper. In a second embodiment exposed copper is subjected to a plasma of $NH_3$ after chemical mechanical polishing, or other etching means, is used to remove the copper down to the top of the trench dielectric. A layer of silicon nitride, SiN, is then immediately deposited in situ over the exposed copper. A layer of dielectric can then be deposited on the layer of silicon nitride and processing can be continued without contaminating or oxidizing the copper.

18 Claims, 3 Drawing Sheets

ROBUST POST CU-CMP IMD PROCESS

BACKGROUND OF THE INVENTION (1) Field of the Invention

This invention relates to the formation of intermetal dielectric over copper damascene structures and more specifically to methods of cleaning exposed copper between the steps of chemical mechanical polishing and intermetal dielectric deposition.

(2) Description of the Related Art

As the cross section area of conductors in integrated circuits continue to shrink the conductivity of the conductor material becomes increasingly important. While aluminum has long been the conductor material of choice in integrated circuits, materials having greater conductivity such as gold, silver, copper, or the like are used with increasing frequency.

These metals have not had more widespread use because they suffer from a number of disadvantages such as the formation of undesirable intermetallics and high diffusion rates. Copper has the additional disadvantage of being easily oxidized at relatively low temperatures. One particular problem of this easy oxidation of copper is that conventional photoresist processing can not be used to pattern the copper. At the end of the patterning process using photoresist the photoresist must be removed by heating it in a highly oxidizing environment which also oxidizes the copper conductors. One solution to this problem is the Damascene process for forming copper conductors.

Although the damascene process for forming copper conductors avoids the use of photoresist to pattern the copper conductors, processing steps such as chemical mechanical polishing to remove excess copper are required. Care must be taken to avoid oxidation of the exposed copper or contamination of the exposed copper by other means.

U.S. Pat. No. 5,744,376 to Chan et al. describes a method of forming copper interconnections using a damascene structure with provisions to prevent both copper diffusion and copper oxidation.

U.S. Pat. No. 5,693,563 to Teong describes a method of forming copper interconnections using an etch stop in a double damascene structure having provision to prevent both copper diffusion and oxidation.

U.S. Pat. No. 5,818,110 to Cronin describes an integrated circuit chip wiring structure using a multi-damascene approach.

U.S. Pat. No. 5,814,557 to Venkatraman et al. describes a method of forming an interconnect structure including a dual-damascene structure.

Patent application Ser. No. 09/349,847, filed Jul. 8, 1999, entitled "METHOD OF FABRICATING A DAMASCENE STRUCTURE FOR COPPER MEDULLIZATION" and assigned to the same Assignee describes a method of forming a copper damascene structure over a filled contact hole and the use of a sacrificial dielectric layer to protect an etch stop layer during chemical mechanical polishing.

Patent application Ser. No. 09/374,309 filed Aug. 16, 1999, entitled "PASSIVATION METHOD FOR COPPER PROCESS" and assigned to the same Assignee describes methods of passivation of exposed copper in a copper damascene structure.

SUMMARY OF THE INVENTION

Forming damascene conductor structures using copper or other conducting materials requires the deposition of a layer of trench dielectric. A trench is then etched in the layer of trench dielectric to define the shape of the conductor. A layer of barrier metal is then deposited over the trench dielectric, on the sidewalls of the trench, and on the bottom of the trench. A conductor metal, such as copper, is then deposited on the layer of barrier metal to more than fill the trench. The barrier metal and conductor metal are then removed down to the level of the trench dielectric, usually using a method such as chemical mechanical polishing, to define the conductor.

After the chemical mechanical polishing is completed the structure is covered by a layer of dielectric followed by further processing steps. It is important to keep the exposed copper clean, or to remove any oxides or contamination which may have formed, prior to the deposition of the layer of dielectric.

It is a principle objective of this invention to provide a method of treating exposed copper in a copper damascene structure, after chemical mechanical polishing and before deposition of a layer of dielectric, which insures that the exposed copper is clean and delamination between the copper and dielectric is prevented.

This objective is achieved by annealing the copper in a forming gas, $N_2$—$H_2$, atmosphere after chemical mechanical polishing followed by deposition of a cap dielectric layer of silicon nitride, SiN. Additional dielectric is then deposited on the cap layer of silicon nitride.

This objective is also achieved by treating the exposed copper in situ with an $NH_3$ plasma followed by in-situ deposition of a cap dielectric layer of silicon nitride, SiN. Additional dielectric is then deposited on the cap layer of silicon nitride.

DESCRIPTION OF THE PREFERRED EMBODIMENTS

Figure 1:
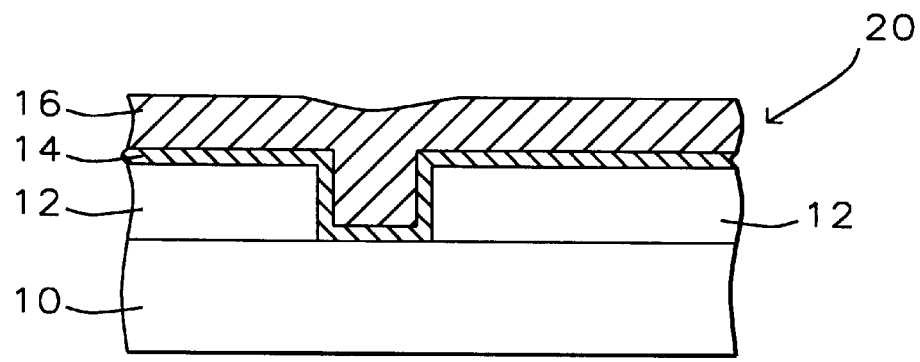
FIG. 1 shows an cross section of a part of an integrated circuit wafer showing a trench dielectric with a trench formed therein, a layer of barrier metal covering the top of the trench dielectric and sidewalls and bottom of the trench, and a layer of copper covering the layer of barrier metal and more than filling the trench.

Refer now to FIGS. 1–6 for a description of the method of cleaning the exposed copper during the fabrication of a copper damascene structure of this invention. FIG. 1 shows a cross section view of a part of an integrated circuit wafer 20. The wafer comprises a silicon substrate 10 having devices formed therein, not shown, and dielectric layers formed thereon, not shown. A layer of trench dielectric 12, such as silicon dioxide or other low dielectric constant dielectric, is formed on the silicon substrate 10 and a trench is etched in the layer of trench dielectric 12.

Figure 2:
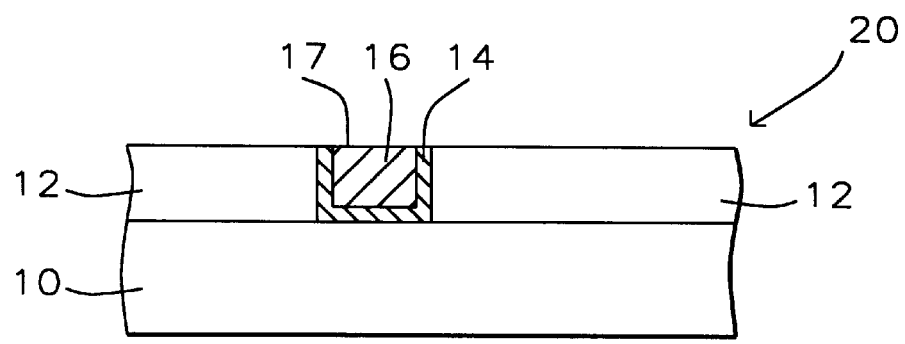
FIG. 2 shows a cross section of the part of the integrate circuit wafer of FIG. 1 after the barrier metal and copper above the top of the layer of trench dielectric have been removed.

A layer of barrier metal 14, such as tantalum or tantalum nitride, is then deposited on the wafer 20 covering the layer of trench dielectric 12, the sidewalls of the trench and the bottom of the trench. A layer of copper 16 is then deposited on the layer of barrier metal 14 having a thickness sufficient to more than fill the trench in the layer of trench dielectric. Next, as shown in FIG. 2, the copper 16 and the barrier metal 14 is removed down to the level of the top of the layer of trench dielectric 12. This removal of the copper and barrier metal is usually accomplished using chemical mechanical polishing, CMP, but can also be accomplished using other methods of back etching.

The CMP, or other etching means, removal of the copper and barrier metal down to the level of the top of the layer of trench dielectric 12 leaves an exposed copper surface 17, as shown in FIG. 2. This exposed copper surface must be covered with a barrier material in order to prevent oxidation of the exposed copper surface 17. Preferably this barrier material is silicon nitride, SiN, but the exposed copper surface must be free of oxidation or other contamination in order to prevent delamination between the copper surface 17 and a layer of silicon nitride.

Figure 3:
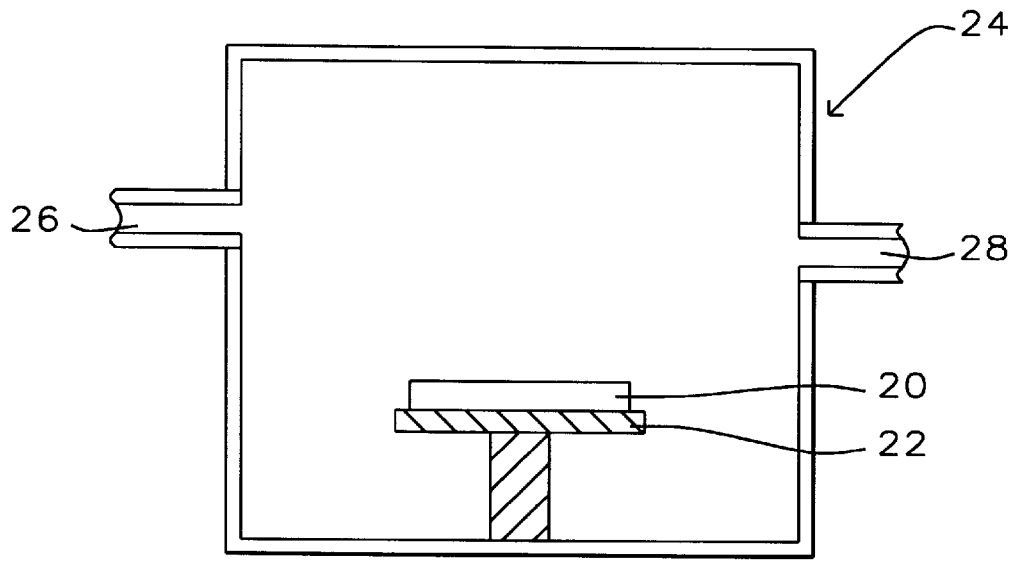
FIG. 3 shows a chamber for annealing the exposed copper in an atmosphere of forming gas, $N_2$—$H_2$, followed by in-situ deposition of a layer of silicon nitride, SiN.

Refer to FIG. 3 for an embodiment of a method of insuring the copper surface is free of oxides or other contamination. After the CMP, or other etching means, removal of the copper and barrier metal down to the level of the top of the layer of trench dielectric the wafer 20 is placed on a wafer holder 22 in a chamber 24. An inlet gas port 26 and an exhaust gas port 28 control the pressure and atmosphere in the chamber 24. The wafer is then heated so that the copper is annealed in a reducing environment at a temperature of between about 200° C. and 450° C. for between about 10 and 60 minutes. In this embodiment the reducing environment is forming gas and the inlet gas port 26 and exhaust gas port 28 provide a forming gas environment in the chamber 24. The forming gas is a mixture of hydrogen gas, $H_2$, and nitrogen gas, $N_2$, in a ratio of about 10:1 nitrogen to hydrogen. The wafer is then heated so that the copper is annealed in the forming gas environment at a temperature of between about 200° C. and 450° C. for between about 10 and 60 minutes. This anneal results in a copper surface completely free of oxides or other contamination.

Figure 5:
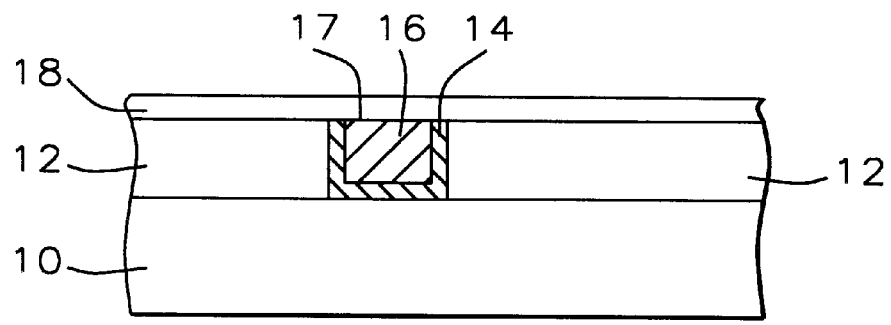
FIG. 5 shows a cross section of the part of the integrate circuit wafer of FIG. 2 after a layer of silicon nitride, SiN, has been deposited.
Figure 6:
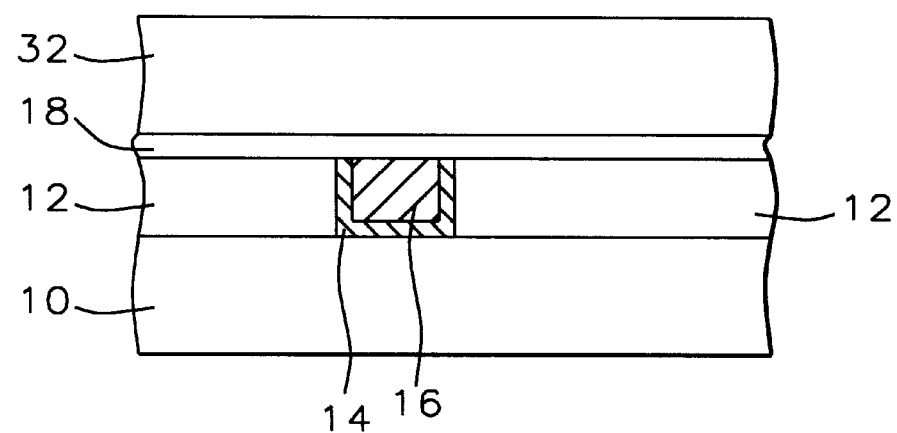
FIG. 6 shows a cross section of the part of the integrate circuit wafer of FIG. 6 after a layer of dielectric has been deposited on the layer of silicon nitride, SiN.

As shown in FIG. 5, a layer of silicon nitride 18 is then immediately deposited on the wafer covering the copper surface 17 with silicon nitride 18. The silicon nitride is preferably deposited in-situ without removing the wafer from the chamber 24 or opening the chamber 24. The silicon nitride is deposited using a means such as chemical vapor deposition and preferably has a thickness of between about 200 and 1000 Angstroms. As shown in FIG. 6 a layer of dielectric 32 can then be deposited on the layer of silicon nitride and processing of the wafer can continue and the copper is protected from oxidation or other contamination and delamination between the copper and silicon nitride will not occur.

Figure 4:
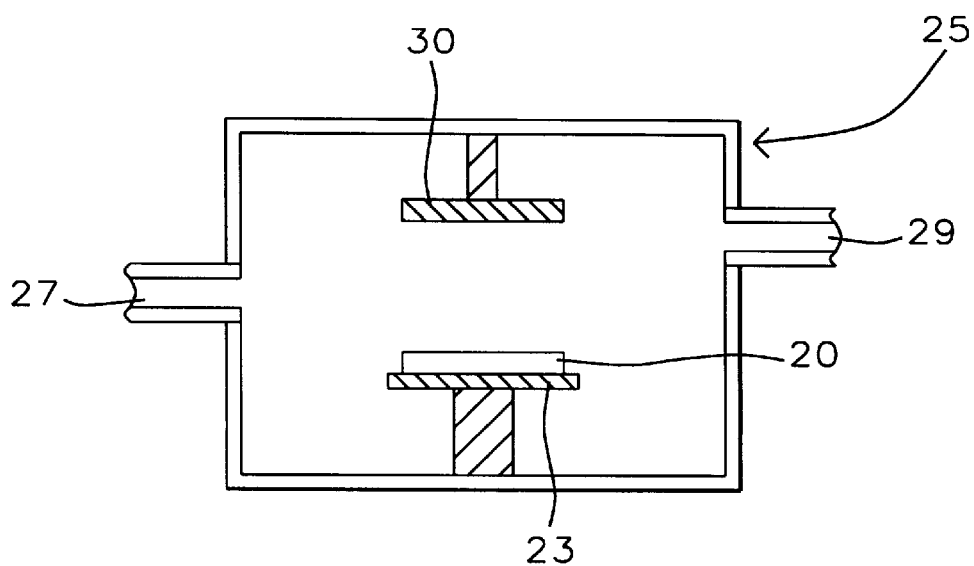
FIG. 4 shows a chamber for treating the exposed copper with an $NH_3$ plasma followed by in-situ deposition of a layer of silicon nitride, SiN.

Refer to FIG. 4 for another embodiment of a method of insuring the copper surface is free of oxides or other contamination. After the CMP, or other etching means, removal of the copper and barrier metal down to the level of the top of the layer of trench dielectric the wafer 20 is placed on a wafer holder 23 in a chamber 25. An inlet gas port 27 and an exhaust gas port 29 control the pressure and atmosphere in the chamber 25. An electrode 30 is also provided in the chamber. A plasma discharge of $NH_3$ is then established in the chamber 25 between the wafer 20 and the electrode 30. This plasma is continued for between about 0.5 and 5.0 minutes and results in a copper surface completely free of oxides or other contamination.

Next, as shown in FIG. 5, a layer of silicon nitride 18 is then immediately deposited on the wafer covering the copper surface 17 with silicon nitride 18. The silicon nitride is deposited in-situ without removing the wafer 20 from the chamber 25 or opening the chamber 25. The silicon nitride is deposited using means such as chemical vapor deposition and preferably has a thickness of between about 200 and 1000 Angstroms. As shown in FIG. 6 a layer of dielectric 32 can then be deposited on the layer of silicon nitride and processing of the wafer can continue and the copper is protected from oxidation or other contamination and delamination between the copper and silicon nitride will not occur.

While the invention has been particularly shown and described with reference to the preferred embodiments thereof, it will be understood by those skilled in the art that various changes in form and details may be made without departing from the spirit and scope of the invention.

What is claimed is:

1. A method of passivating a copper damascene structure, comprising:

providing a wafer having a layer of first dielectric formed thereon;

etching trenches in said layer of first dielectric;

depositing a layer of barrier metal on said layer of first dielectric and on all sides and bottoms of said trenches;

depositing a layer of copper on said layer of barrier metal, thereby more than filling said trenches with copper;

removing said copper and said barrier metal down to the level of the top of said layer of first dielectric thereby forming a damascene structure having exposed copper;

annealing said copper in a reducing atmosphere after forming said damascene structure having exposed copper;

depositing a layer of silicon nitride, SiN, on said wafer immediately after annealing said copper, thereby covering said first dielectric and said damascene structure having exposed copper with silicon nitride, SiN; and forming a layer of second dielectric on said layer of silicon nitride.

2. The method of claim 1 wherein said annealing said copper is accomplished using a temperature of between about 200° C. and 450° C. for between about 10 and 60 minutes.

3. The method of claim 1 wherein said reducing atmosphere comprises a mixture of nitrogen, $N_2$, and hydrogen, $H_2$.

4. The method of claim 3 wherein said mixture of nitrogen, $N_2$, and hydrogen, $H_2$, has a ratio of nitrogen to hydrogen of about ten to one.

5. The method of claim 1 wherein said removing said copper and said barrier metal down to the level of the top of said layer of first dielectric is accomplished using chemical mechanical polishing.

6. The method of claim 1 wherein said layer of silicon nitride, SiN, has a thickness of between about 200 and 1000 Angstroms.

7. The method of claim 1 wherein said first dielectric is silicon oxide.

8. The method of claim 1 wherein said wafer has devices formed therein.

9. The method of claim 1 wherein said barrier metal is tantalum.

10. The method of claim 1 wherein said barrier metal is tantalum nitride.

11. A method of passivating a copper damascene structure, comprising:

provicing a wafer having a layer of first dielectric formed thereon;

etching trenches in said layer of first dielectric;

depositing a layer of barrier metal on said layer of first dielectric and on all sides and bottoms of said trenches;

depositing a layer of copper on said layer of barrier metal, thereby more than filling said trenches with copper;

removing said copper and said barrier metal down to the level of the top of said layer of first dielectric thereby forming a damascene structure having exposed copper;

placing said wafer in a chamber after forming said damascene structure;

closing said chamber after placing said wafer in said chamber;

subjecting said damascene structure having exposed copper to a plasma of $NH_3$ for a first time, after closing said chamber;

depositing a layer of silicon nitride, SiN, on said wafer immediately after subjecting the damascene structure having exposed copper to a plasma of $NH_3$ and before opening said chamber;

opening said chamber after depositing said layer of silicon nitride, SiN;

removing said wafer from said chamber after opening said chamber; and forming a layer of second dielectric on said layer of silicon nitride.

12. The method of claim 11 wherein said first time is between about 10 and 60 minutes.

13. The method of claim 11 wherein said removing said copper and said barrier metal down to the level of the top of said layer of first dielectric is accomplished using chemical mechanical polishing.

14. The method of claim 11 wherein said layer of silicon nitride, SiN, has a thickness of between about 200 and 1000 Angstroms.

15. The method of claim 11 wherein said first dielectric is silicon oxide.

16. The method of claim 11 wherein said wafer has devices formed therein.

17. The method of claim 11 wherein said barrier metal is tantalum.

18. The method of claim 11 wherein said barrier metal is tantalum nitride.

* * * * *